United States Patent
Yamaoka et al.

(10) Patent No.: US 9,846,420 B2
(45) Date of Patent: Dec. 19, 2017

(54) SEQUENCE-PROGRAM DESIGN SUPPORT DEVICE

(75) Inventors: Takayuki Yamaoka, Chiyoda-ku (JP); Yasumichi Maruyama, Chiyoda-ku (JP); Masahiro Hattori, Nagoya (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 524 days.

(21) Appl. No.: 14/382,360

(22) PCT Filed: Mar. 26, 2012

(86) PCT No.: PCT/JP2012/057827
§ 371 (c)(1),
(2), (4) Date: Sep. 2, 2014

(87) PCT Pub. No.: WO2013/145106
PCT Pub. Date: Oct. 3, 2013

(65) Prior Publication Data
US 2015/0005907 A1    Jan. 1, 2015

(51) Int. Cl.
*G06F 3/0484*    (2013.01)
*G05B 19/042*    (2006.01)
*G06F 17/50*    (2006.01)

(52) U.S. Cl.
CPC ......... *G05B 19/042* (2013.01); *G06F 3/0484* (2013.01); *G06F 17/5054* (2013.01);
(Continued)

(58) Field of Classification Search
None
See application file for complete search history.

(56) References Cited

U.S. PATENT DOCUMENTS 4,891,763 A * 1/1990 Kuriyama ........ G05B 19/40931
700/183
5,168,441 A   12/1992 Onarheim et al.
(Continued)

FOREIGN PATENT DOCUMENTS

JP    05-507376 A    10/1993
JP    09-212213 A     8/1997
(Continued)

OTHER PUBLICATIONS

Communication dated Dec. 11, 2015, issued by the German Patent Office in counterpart German Application No. 112012006104.7.
(Continued)

*Primary Examiner* — Tuan Dao
(74) *Attorney, Agent, or Firm* — Sughrue Mion, PLLC; Richard C. Turner

(57) ABSTRACT

A sequence-program design support device includes a display unit displaying a work screen corresponding to a designing work, an input unit receiving a setting operation of work phases, a zoom-in operation, and a zoom-out operation, a state storage unit storing the work phases and a current work, a work-model storage unit storing a partial order relation of a work specified for each of the work phases with a work screen corresponding to the work, and a control unit displaying a work screen corresponding to a next work of the current work in the order relation and storing the next work when the input unit receives the zoom-in operation with a first operation amount, and displaying a work screen corresponding to a previous work of the current work in the order relation and storing the previous work when the input unit receives the zoom-out operation with a second operation amount.

6 Claims, 5 Drawing Sheets

(52) U.S. Cl.
CPC .............. *G05B 2219/13145* (2013.01); *G09G 2340/045* (2013.01)

(56) References Cited

U.S. PATENT DOCUMENTS

| | | | |
|---|---|---|---|
| 2001/0030667 A1* | 10/2001 | Kelts | G06F 3/0481 715/854 |
| 2002/0113822 A1 | 8/2002 | Windl et al. | |
| 2005/0175079 A1* | 8/2005 | Gamper | G01R 13/0209 375/228 |
| 2007/0005266 A1 | 1/2007 | Blevins et al. | |
| 2007/0061786 A1 | 3/2007 | Zhou et al. | |
| 2007/0106761 A1 | 5/2007 | Beoughter et al. | |
| 2007/0130572 A1 | 6/2007 | Gilbert et al. | |
| 2007/0132779 A1 | 6/2007 | Gilbert et al. | |
| 2007/0139441 A1 | 6/2007 | Lucas et al. | |
| 2007/0150081 A1 | 6/2007 | Nixon et al. | |
| 2007/0165031 A1 | 7/2007 | Gilbert et al. | |
| 2007/0168060 A1 | 7/2007 | Nixon et al. | |
| 2007/0168065 A1 | 7/2007 | Nixon et al. | |
| 2007/0174225 A1 | 7/2007 | Blevins et al. | |
| 2007/0179641 A1 | 8/2007 | Lucas et al. | |
| 2007/0211079 A1 | 9/2007 | Nixon et al. | |
| 2008/0066004 A1 | 3/2008 | Blevins et al. | |
| 2008/0279475 A1 | 11/2008 | Lee et al. | |
| 2008/0300698 A1 | 12/2008 | Havekost et al. | |
| 2009/0235186 A1* | 9/2009 | Howard | G06F 17/30905 715/760 |
| 2010/0168874 A1 | 7/2010 | Lucas et al. | |
| 2010/0188410 A1 | 7/2010 | Gilbert et al. | |
| 2010/0222899 A1 | 9/2010 | Blevins et al. | |
| 2011/0252355 A1 | 10/2011 | Nixon et al. | |
| 2012/0324357 A1* | 12/2012 | Viegers | G06F 3/0481 715/730 |

FOREIGN PATENT DOCUMENTS

| | | |
|---|---|---|
| JP | 2002-182739 A | 6/2002 |
| JP | 2007-536632 A | 12/2007 |
| JP | 2008-310688 A | 12/2008 |
| JP | 2009-205302 A | 9/2009 |
| JP | 2010-211378 A | 9/2010 |
| JP | 2010-231291 A | 10/2010 |

OTHER PUBLICATIONS

Communication dated Dec. 8, 2015, issued by the Korean Intellectual Property Office in counterpart Korean Application No. 10-2014-7028786.
International Search Report for PCT/JP2012/057827 dated May 1, 2012 [PCT/ISA/210].
Written Opinion for PCT/JP2012/057827 dated May 1, 2012 [PCT/ISA/237].
Communication dated Jun. 28, 2016, from the Korean Intellectual Property Office in corresponding application No. 10-2014-7028786.

* cited by examiner

FIG.6

| WORK PHASE NAME | WORK NAME | WORK SCREEN |
|---|---|---|
| INITIAL STATE | INITIAL STATE | UNIT CONFIGURATION DIAGRAM |
| SYSTEM DESIGN PHASE | (0) INITIAL STATE | UNIT CONFIGURATION DIAGRAM |
| | (1) PARAMETER SETTING | PARAMETER SETTING SCREEN |
| | (2) AUTOMATIC REFRESH SETTING | AUTOMATIC REFRESH SETTING SCREEN |
| PROGRAMMING PHASE | (0) INITIAL STATE | UNIT CONFIGURATION DIAGRAM |
| | (1) POU PROGRAM CREATION | PROGRAM EDITOR |
| | (2) FB PROGRAM CREATION | PROGRAM EDITOR |

FIG.7

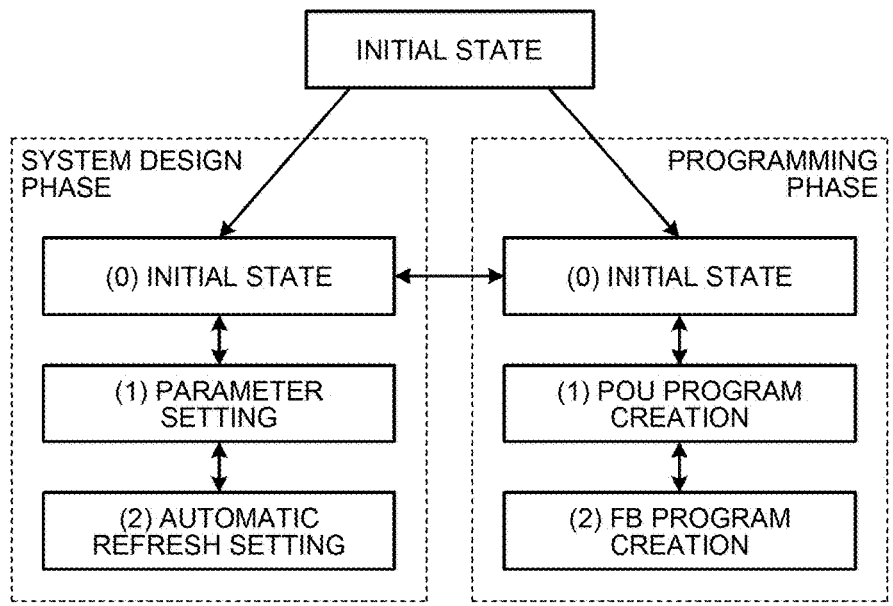

SEQUENCE-PROGRAM DESIGN SUPPORT DEVICE

CROSS REFERENCE TO RELATED APPLICATIONS

This application is a National Stage of International Application No. PCT/JP2012/057827 filed Mar. 26, 2012, the contents of all of which are incorporated herein by reference in their entirety.

FIELD

The present invention relates to a sequence-program design support device that streamlines creation of sequence programs and setting of parameters for a programmable logic controller (PLC) system.

BACKGROUND

In a conventional engineering tool for a programmable logic controller, in order to display a sequence-program edit screen and a unit-parameter setting screen, a selection is performed from a tool menu or a project list (a navigation window). That is, every time a program is edited or a parameter is set, a mouse (a pointer) is moved from the program edit screen or the parameter setting screen to the menu or the navigation window to select a display object. Therefore, the work efficiency at the time of editing the program or setting the parameter is decreased.

In view of such a problem, for example, Patent Literature 1 describes a technology related to a plant monitoring control device that displays plant facility operation statuses and measurement values. In this technology, only by specifying an arbitrary position on a screen by a mouse and rotating a scroll wheel (a mouse wheel) to issue a magnification (zoom-in operation) instruction and a reduction (zoom-out operation) instruction, the screen is magnified or reduced while centering on the specified position. When the rate of the magnification or reduction exceeds a set value, an optimum screen including information required by a user is provided to the user by switching the screen to a detailed view or a schematic diagram.

CITATION LIST

Patent Literature

Patent Literature 1: Japanese Patent Application Laid-open No. 2010-231291

SUMMARY

Technical Problem

However, according to the conventional technology, at the time of switching a work screen corresponding to a work desired to be performed by a user, a mouse (a pointer) needs to be largely moved by the operation mentioned in the paragraph [0002], thereby decreasing the work efficiency.

The present invention has been achieved to solve the above problems, and an object of the present invention is to provide a sequence-program design support device having a high work efficiency.

Solution to Problem

In order to solve above-mentioned problems and achieve the object, a sequence-program design support device according to the present invention includes a screen display unit that displays a work screen corresponding to a work in designing a sequence program of a programmable logic controller; an input unit that receives a setting operation of a work phase in designing the sequence program, a zoom-in operation accompanied by an operation amount, and a zoom-out operation accompanied by an operation amount; a work-state storage unit that stores therein the work phase received by the input unit and a current one of the work; a work-model storage unit that stores therein a partial order relation of a work specified for each of the work phases together with a work screen corresponding to the work; and a display control unit that displays a work screen corresponding to a next work of the current work in the partial order relation on the screen display unit and stores the next work in the work-state storage unit when the input unit receives the zoom-in operation with the operation amount being equal to or larger than a first threshold, and displays a work screen corresponding to a previous work of the current work in the partial order relation on the screen display unit and stores the previous work in the work-state storage unit when the input unit receives the zoom-out operation with the operation amount being equal to or larger than a second threshold.

Advantageous Effects of Invention

The sequence-program design support device according to the present invention can reduce working hours for establishing a PLC system.

BRIEF DESCRIPTION OF DRAWINGS

FIG. 6 depicts a work model for establishing a PLC system stored in a work-model storage unit.

FIG. 7 is a diagram expressing FIG. 6 in a hierarchical structure.

DESCRIPTION OF EMBODIMENTS

An engineering tool for a programmable logic controller (PLC) system is software for editing a sequence program that sets a control sequence performed by the programmable logic controller and setting a parameter. Such an engineering tool functions as a sequence-program design support device in a state of being installed in a personal computer or the like. Editing of the sequence program and setting of the parameter are performed by displaying a program edit screen and a parameter setting screen on a monitor of a personal computer and the like having the software installed therein.

Figure 1:
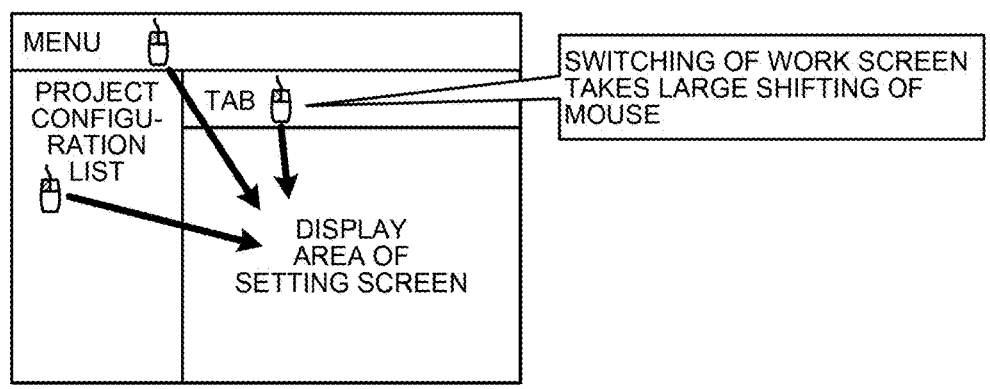
FIG. 1 depicts a method of displaying a program edit screen and a unit-parameter setting screen in a conventional engineering tool.

In a conventional engineering tool, in order to display a program edit screen and a unit-parameter setting screen, a selection is made from a tool menu or a project list (a navigation window). That is, every time a program is edited or a parameter is set, as shown in FIG. 1, a mouse is moved from the program edit screen or the parameter setting screen to the menu or the navigation window to select a display object. Therefore, the work efficiency at the time of editing the program or setting the parameter is decreased.

Figure 2:
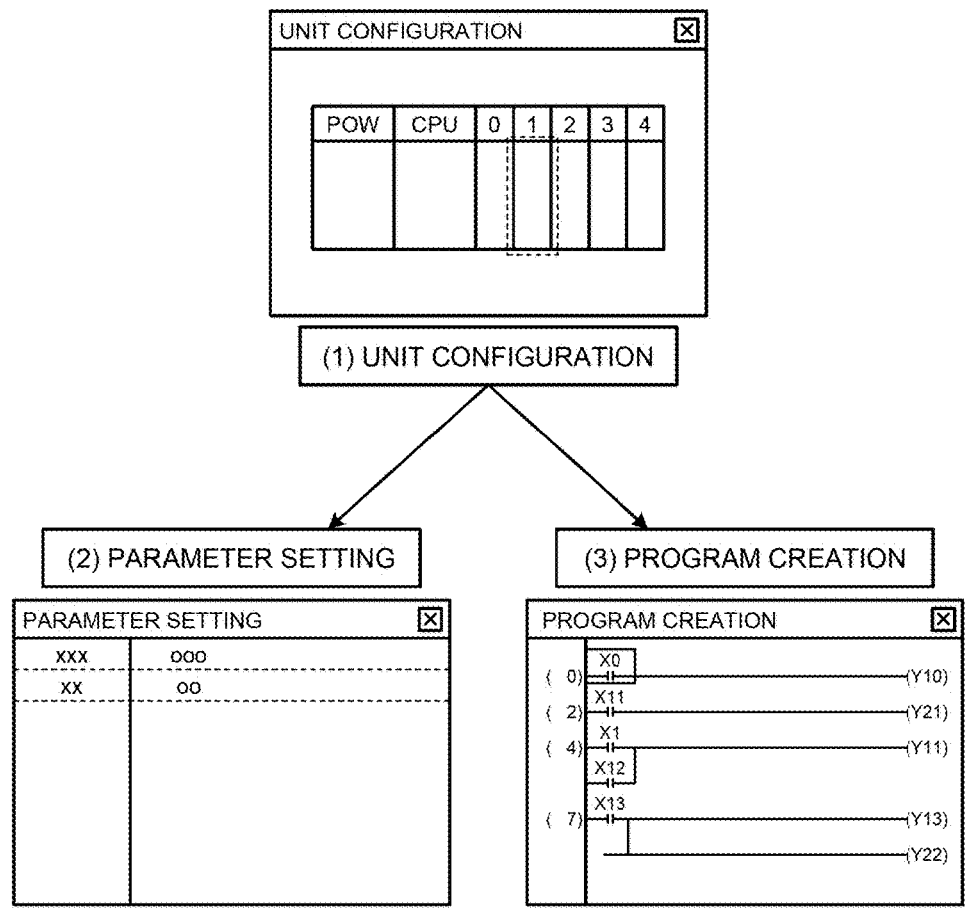
FIG. 2 depicts a state where a screen selected from a "unit configuration" screen according to a work status is different.
Figure 3:
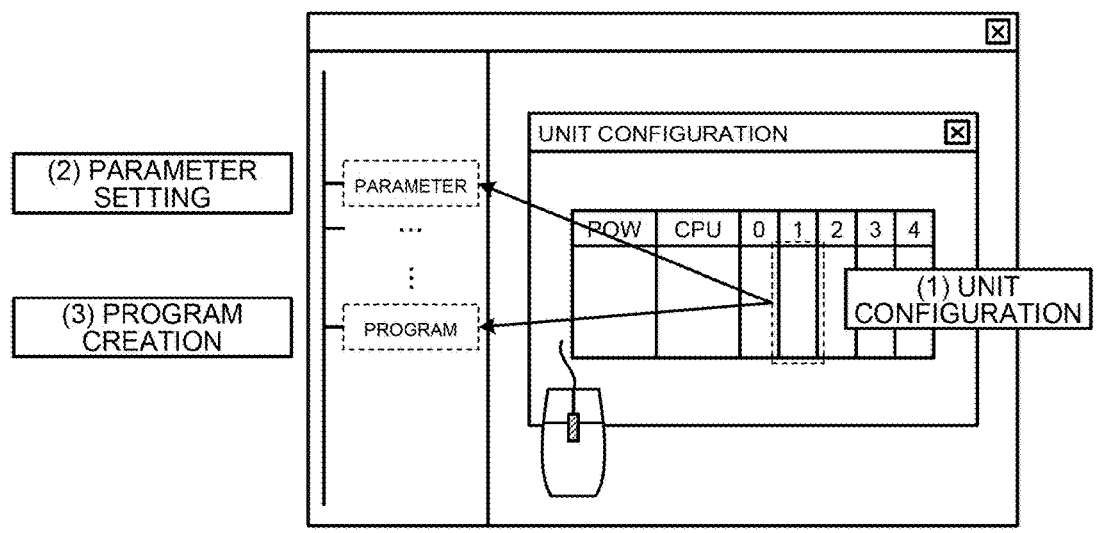
FIG. 3 depicts a state where a screen of "parameter setting" or "program creation" is selected from a screen of "unit configuration" in a conventional technology.

For example, as shown in FIG. 2, the selection of a unit from a screen of "(1) unit configuration" to perform "(2) parameter setting" or "(3) program creation" of the unit is different depending on a work state (a work phase). Conventionally, in order to switch the screen depending on the work state, for example, it is necessary to move a mouse (a pointer) to the project list, as shown in FIG. 3, which depicts a specific operation, to perform a selection operation of selecting the "(2) parameter setting" screen of the unit or the "(3) program creation" screen related to the unit.

Exemplary embodiments of a sequence-program design support device 10 according to the present invention will be explained below in detail with reference to the accompanying drawings. The present invention is not limited to the embodiments.

Embodiment

Figure 4:
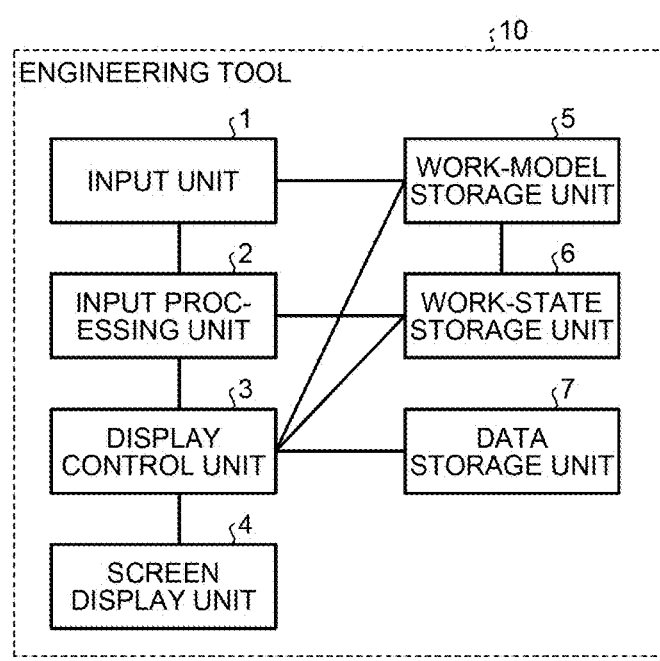
FIG. 4 depicts a basic configuration of a sequence-program design support device (engineering tool) according to an embodiment of the present invention.

FIG. 4 depicts a basic configuration of the sequence-program design support device (engineering tool) 10 according to an embodiment of the present invention. As described above, the sequence-program design support device 10 can have a configuration constituted by a personal computer having engineering tool software installed therein and the like.

An outline of respective constituent elements of the sequence-program design support device 10 is explained below.

Input Unit 1:

An input unit 1 is a part that recognizes a mouse operation and a key input on a screen of an engineering tool, and that receives a switching operation of a work phase and a zoom-in/zoom-out operation performed by a mouse wheel. In the work-phase switching operation, a list of work phases (a system design phase and a programming phase) set in a work-model storage unit 5 explained below is read and displayed in the menu or the like, thereby prompting a user to perform a selection.

Input Processing Unit 2:

An input processing unit 2 performs a process corresponding to an input from the input unit 1. Specifically, the input processing unit 2 performs the following operations.

(1) When a work-phase switching operation is performed, the input processing unit 2 causes a selected work phase to be stored in a work-state storage unit 6 explained below.

(2) When a zoom-in/zoom-out operation is performed, the input processing unit 2 informs a display control unit 3 of an operation type (zoom-in, zoom-out) and an operation amount (the number of rotations of a mouse wheel).

Display Control Unit 3:

The display control unit 3 decides a screen to be displayed next according to an operation specified in the explanation (2) of the input processing unit 2. Specifically, the display control unit 3 is operated as follows.

(1) When an operation amount does not reach a screen switching threshold, the display control unit 3 performs zoom-in and zoom-out display of the current screen.

(2) When the operation amount has reached the screen switching threshold (the operation amount being an amount equal to or larger than a threshold), the display control unit 3 decides the next work screen based on information stored in the work-model storage unit 5 explained below from a work phase selected in the work-state storage unit 6 explained below and the current work screen, and informs a screen display unit 4 explained below of the next screen. Even if the operation amount is equal to or larger than the screen switching threshold, the screen to be displayed next becomes different depending on the operation type (zoom-in, zoom-out).

Screen Display Unit 4:

The screen display unit 4 is a display of a personal computer or the like constituting the sequence-program design support device 10 (engineering tool), and the screen display unit 4 displays a screen decided by the display control unit 3.

Work-Model Storage Unit 5:

The work-model storage unit 5 registers, for a work phase to be performed on an engineering tool, (1) a work flow (a sequence) for performing the work phase and (2) a work screen to be used in each work. A specific example thereof is described later.

Work-State Storage Unit 6:

On the sequence-program design support device 10, the work-state storage unit 6 stores therein (1) a work phase currently selected and (2) a work name currently displayed.

Date Storage Unit 7:

A data storage unit 7 stores therein data (a unit configuration and a program or a parameter currently being created) displayed on the current work screen. When switching of the screen occurs, data to be displayed on the screen is read from the data storage unit 7.

A specific operation of the sequence-program design support device 10 according to the present embodiment is explained below.

To establish a programmable logic controller (PLC) system, it is required to decide a unit configuration such as a power source, a CPU, and input/output, to set a parameter of a unit to be used, and to create a control program using the unit. As a premise of operations of the sequence-program design support device 10, a work model for establishing the PLC system as shown in FIG. 6 is set in advance in the work-model storage unit 5. This setting is registered (stored) in the tool at the time of shipment of engineering tools.

In an example shown in FIG. 6, as the work phase name, a system design phase and a programming phase can be mentioned along with an initial state (where a work phase is not selected). The system design phase substantially includes two works. That is, first, there is (0) initial state (a work screen at this time is "unit configuration diagram"), then (1) parameter setting is performed (a work screen at this time is "parameter setting screen"), and finally (2) automatic refresh setting is performed (a work screen at this time is "automatic refresh setting screen"). The programming phase substantially includes two works. That is, first, there is (0) initial state (a work screen at this time is "unit configuration diagram"), then (1) POU program creation (a work screen at this time is "program editor") is performed, and finally (2) FB program creation is performed (a work screen at this time is "program editor").

FIG. 7 is a diagram expressing FIG. 6 in a hierarchical structure. In the system design phase, the working sequence is specified in an order of "(0) initial state", "(1) parameter setting", and "(2) automatic refresh setting" (of the system design phase). The next work of the "(0) initial state (of the system design phase) is the "(1) parameter setting", and the next work of the "(1) parameter setting" is the "(2) automatic refresh setting". A previous work of the "(2) automatic refresh setting" is the "(1) parameter setting", and a previous work of the "(1) parameter setting" is the "(0) initial state" (of the system design phase). The same applies to the programming phase.

Operations of the sequence-program design support device 10 are explained below with reference to FIG. 5, which depicts an image of operations of the sequence-program design support device 10 including a user operation on the screen display unit 4.

(1) Creation of Unit Configuration

When a user activates the sequence-program design support device 10 (engineering tool), the "unit configuration diagram" is displayed on the screen display unit 4. The user arranges units to be used on the unit configuration diagram to create a unit configuration such as a power source, a CPU, input/output, and the like. At this time, the work phase is not selected yet and the configuration is in the "initial state".

(2) Work Phase Selection

To set parameters of arranged units, a user selects the work phase "system design". At this time, the tool registers the "system design" phase selected by the input unit 1 in the work-state storage unit 6 via the input processing unit 2. At this time, in the work-state storage unit 6, "system design" is stored as the work phase and "initial state" is stored as the work name. In this case, the "unit configuration diagram" is still displayed on the screen display unit 4.

(3) Zoom-in Operation on Unit

A user performs a zoom-in operation of a mouse wheel on a unit for which the user wishes to set a parameter in the unit configuration diagram. At this time, the input processing unit 2 of the tool receives information of a target unit and the zoom-in operation from the input unit 1. When the input processing unit 2 determines that an operation amount of the mouse wheel is equal to or larger than a first threshold as a certain threshold, the input processing unit 2 makes an inquiry about the next work screen to the work-state storage unit 6. The work-state storage unit 6 refers to the work model setting (FIGS. 6 and 7) registered in the work-model storage unit 5, by using the set work phase "system design" and work name "initial state" as a key, to send a reply of the work screen "parameter setting screen" corresponding to the next work name "(1) parameter setting" subsequent to the work phase "system setting" to the input processing unit 2. The work-state storage unit 6 stores therein the next work name "(1) parameter setting".

The input processing unit 2 having received the reply notifies the target unit and the work screen "parameter setting screen" received from the input unit 1 to the display control unit 3. The display control unit 3 reads parameter data of the received target unit from the data storage unit 7, and instructs the screen display unit 4 to display the read data on the "parameter setting screen" corresponding to the unit.

(4) Parameter Setting of Unit

A user performs, on the "parameter setting screen" displayed by the "(3) zoom-in operation on unit", a parameter setting operation of a target unit similarly to a conventional manner. The set parameter as a work result is stored in the data storage unit 7.

(5) Zoom-Out Operation on Parameter Setting Screen

A user performs a zoom-out operation of a mouse wheel on the "parameter setting screen". The input processing unit 2 receives information of the zoom-out operation and the current target unit from the input unit 1, and if the operation amount of the mouse wheel is equal to or larger than a second threshold as a certain threshold, the input processing unit 2 acquires a screen of a previous work based on the information in the work-state storage unit 6 and the work-model storage unit 5. The second threshold can be same as the first threshold or can be different. At this time, because the previous work of the work name "(1) parameter setting" set in the work-state storage unit 6 is, as shown in FIG. 6 of the work-model storage unit 5, "(0) initial state" (of the work phase "system design phase"), the work-model storage unit 5 returns the corresponding work screen "unit configuration diagram" to the input processing unit 2 as a reply. The work-state storage unit 6 stores therein the previous work name "(0) initial state" (of the work phase "system design phase").

The input processing unit 2 having received the reply notifies the display control unit 3 of the "unit configuration diagram" and the target unit. The display control unit 3 instructs the screen display unit 4 to display the "unit configuration diagram" and set a focus to the target unit.

(6) Switching of Work Phase

A user switches the work phase to the "programming" phase by an operation similar to that of the "(2) work phase selection". At this time, the tool sets "programming phase" in the work phase of the work-state storage unit 6 and the "(0) initial state" (of the work phase "programming phase") in the work name, similarly to the process of the "(2) work phase selection". In this case, the "unit configuration diagram" is still displayed on the screen display unit 4.

(7) Zoom-in Operation on Unit

A user performs a zoom-in operation on a unit for which the user wishes to create a program by an operation identical to that of the "(3) zoom-in operation on unit". When it is determined that the operation amount of a mouse wheel is equal to or larger than a certain threshold, the display on the screen display unit 4 changes from the "unit configuration diagram" to the "program editor" (the program creation screen shown in FIG. 5), as a work screen of the "(1) POU program creation", similarly to the "(3) zoom-in operation on unit". That is, a program editor of a program related to a target unit (a unit in which the zoom-in operation is performed by pointing the unit by a mouse (a pointer)) is opened. It is assumed that relating of a program with the unit has been performed by a separate work and has been registered in the data storage unit 7.

(8) Edit of Program Using Unit

A user edits a program by an editor similar to a conventional editor to complete a control program. Thereafter, if a zoom-out operation is performed, display returns to the "unit configuration diagram". By selecting another unit to perform the zoom-in operation again, the display can be changed to the "program editor" (a program creation screen) related to the unit. In this manner, switching of the screen can be performed while matching a work phase and without largely moving a mouse.

In the above operations, the "(2) work phase selection" and the "(6) switching of work phase" do not need to be performed every time the screen is switched, and only needs to be set once at the time of, for example, opening a tool (at the time of starting the work). At this time, it is also conceivable to display a work phase on a screen, for example in a status bar, so that the work phase can be visibly recognized by the user.

As described above, the user can complete the sequence program for the PLC system by repeatedly performing the works of from (2) to (8). In the sequence-program design support device 10 according to the present embodiment, at the time of opening the parameter setting screen and the program editor, an operation can be performed on the unit configuration diagram without performing an operation of moving to a menu at the top of the screen or to a project list on the left to select a work target. Accordingly, the sequence program can be designed with a workload that is less than that of conventional tools.

That is, because display switching operations of various work screens can be performed with a less number of operations, the working man-hours can be reduced. Furthermore, because the screen related to the work phase and the work target can be managed and displayed in the engineering tool, an error in human judgments and operations can be reduced, thereby enabling to improve the work efficiency. As a result, by using the function of the present method, working hours for establishing a PLC system can be reduced.

Further, as an extension of the sequence-program design support device (engineering tool) 10 according to the present embodiment, an interlocking of the sequence-program design support device with map display application software can be taken into consideration. A conceptual diagram of this idea is shown in FIG. 8.

Figure 5:
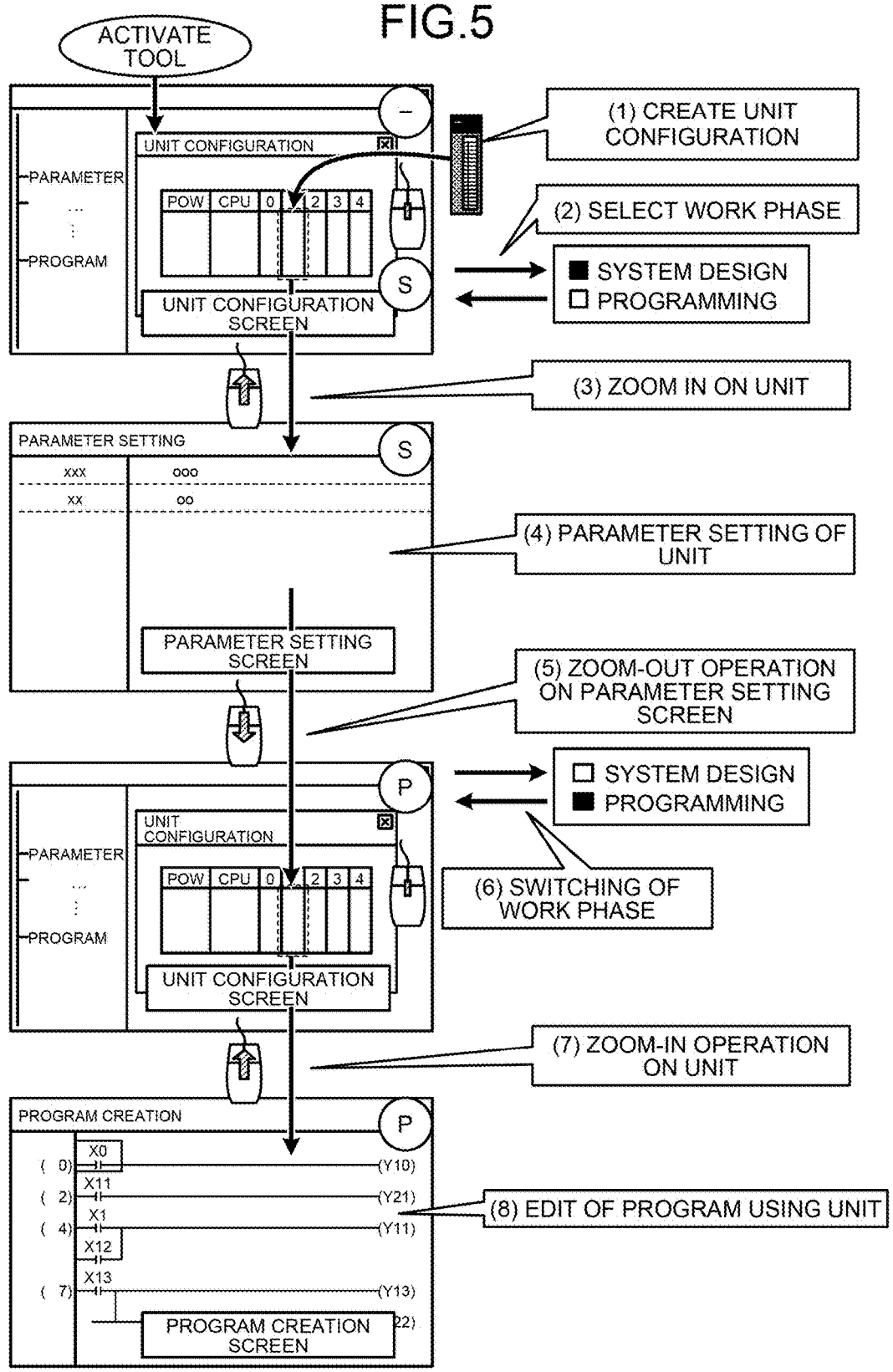
FIG. 5 depicts an image of an operation of the sequence-program design support device including a user operation on a screen display unit.
Figure 8:
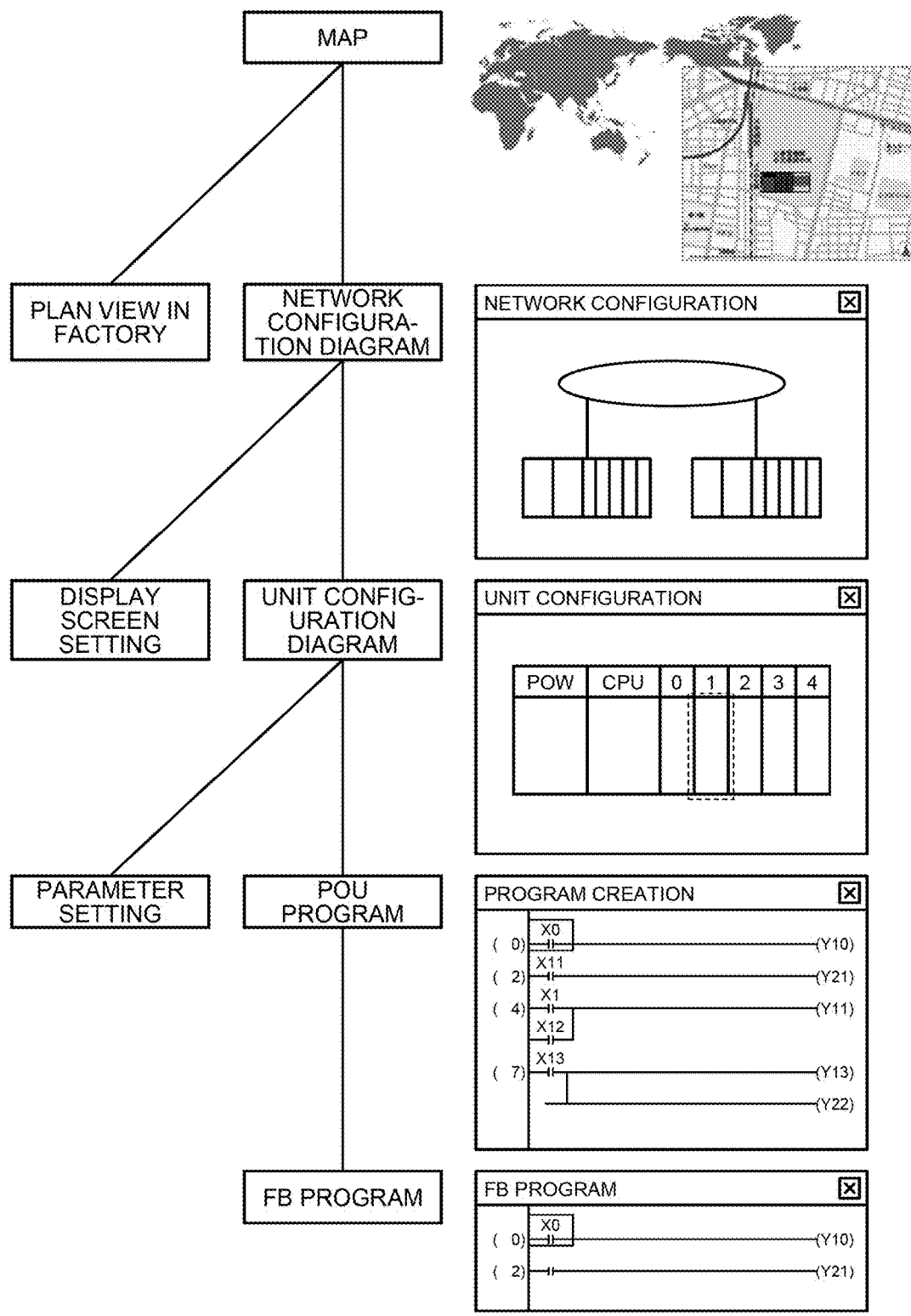
FIG. 8 is a conceptual diagram when the sequence-program design support device according to the embodiment is incorporated in map display application software.

In FIG. 8, by extending work model setting such as "system design" and "programming", shifting from a "map display" screen or "aerial photo" screen in the map display application software to "(1) creation of unit configuration" in FIG. 5 is possible by a zoom-in operation through a hierarchical stage. For example, by a state selection and a zoom-in operation from the "map display" screen, a factory site can be displayed on a "plan view in factory" at the time of "designing device arrangement", or switching from a "network configuration diagram" screen as a network configuration between devices to a work on a "display screen setting" screen using another tool can be performed in a similar manner to those described above. That is, the sequence-program design support device according to the present embodiment and the technical method thereof are applied to a broader concept such as a factory where a PLC system is installed. When a zoom-out operation is performed, it is possible to display a map such as that of a location, building, and factory where a PLC system is installed or a world map (a factory where the facility is installed, a county or country where the factory is located).

Subsequently, by selecting a specific PLC system and performing a zoom-in operation on the "network configuration diagram" screen, the "initial state" screen in the "(1) creation of unit configuration" in FIG. 5 is displayed. Operations thereafter are as explained above. With these operations, the sequence program of the PLC system can be designed efficiently after a hierarchical display level is lowered by a magnification operation from the "map display" screen to the PLC system.

Furthermore, all the setting screens (a screen list including a work phase and a work model table) being display targets can be hierarchically displayed by a zoom-in operation and a zoom-out operation. With this operation, the setting screen can be displayed by specifying a hierarchy, thereby enabling to reduce the number of zoom-in operations until reaching the setting screen. By further adapting the zoom-in operation and the zoom-out operation to an external tool such as a website, supports such as telephone correspondences with customers can be smoothly performed. The state assessment time can be shortened at the time of user's consultations. Further, when information is released to an external tool such as a website, security can be set hierarchically with respect to all setting screens to be zoomed in or zoomed out, in order to prevent leakage of information such as a program.

In the above explanations, a mouse and a mouse wheel have been explained as an example. However, the input unit is not limited to these devices. For example, even on a device in which a keyboard or a mouse input cannot be used, such as a tablet terminal, if continuous input of an operation amount and a selection operation are possible, the sequence-program design support device according to the above embodiment can be realized, and switching of a display can be easily performed with a single operation.

Furthermore, the invention of the present application is not limited to the above embodiment, and when the present invention is carried out, the invention can be variously modified without departing from the scope thereof. Further, in the above embodiment, inventions of various stages are included, and various inventions can be extracted by appropriately combining a plurality of constituent elements disclosed herein. For example, even when some constituent elements are omitted from all constituent elements described in the embodiment, as far as the problems mentioned in the section of Solution to Problem can be solved and effects mentioned in the section of Advantageous Effects of Invention are obtained, the configuration from which some constituent elements have been omitted can be extracted as an invention. In addition, constituent elements mentioned in different embodiments can be appropriately combined.

INDUSTRIAL APPLICABILITY

As described above, the sequence-program design support device according to the present invention is useful for creating a sequence program for a programmable logic controller (PLC) system, and is particularly suitable for improving the work efficiency in designing a sequence program.

REFERENCE SIGNS LIST

1 Input unit
2 Input processing unit
3 Display control unit
4 Screen display unit
5 Work-model storage unit
6 Work-state storage unit
7 Data storage unit
10 Sequence-program design support device

The invention claimed is:
1. A sequence-program design support device comprising:
a screen display unit that displays a work screen corresponding to a work in designing a sequence program of a programmable logic controller;
an input unit that receives a setting operation to set work phases in designing the sequence program, a zoom-in operation accompanied by a first operation amount, and a zoom-out operation accompanied by a second operation amount;
a work-state storage unit that stores therein the work phases received by the input unit and a current work;

a work-model storage unit that stores therein an order of works for performing the work phases together with a work screen corresponding to the work; and a display control unit that displays a work screen corresponding to a next work following the current work in the order on the screen display unit and stores the next work in the work-state storage unit when the input unit receives the zoom-in operation with the first operation amount being equal to or larger than a first threshold, and displays a work screen corresponding to a previous work preceding the current work in the order on the screen display unit and stores the previous work in the work-state storage unit when the input unit receives the zoom-out operation with the second operation amount being equal to or larger than a second threshold.

2. The sequence-program design support device according to claim 1, wherein the input unit is a mouse and the operation amount is a number of rotations of a mouse wheel.

3. The sequence-program design support device according to claim 1, wherein the first threshold and the second threshold are equal to each other.

4. The sequence-program design support device according to claim 1, wherein a first work in the order is an initial state, and a work screen corresponding thereto is a unit configuration diagram of the programmable logic controller.

5. The sequence-program design support device according to claim 4, wherein, when the work phase is not set, the screen display unit displays the unit configuration diagram of the programmable logic controller.

6. The sequence-program design support device according to claim 5, wherein the screen display unit displays the unit configuration diagram of the programmable logic controller in association with map display application software, in a state where the work phase is not set when a hierarchical display level is lowered by a magnification operation from a map display screen to the programmable logic controller.

* * * * *